(12) United States Patent
Seo et al.

(10) Patent No.: US 11,501,702 B2
(45) Date of Patent: Nov. 15, 2022

(54) ELECTRONIC DEVICE WITH IMPROVED OVERCURRENT PROTECTION RELIABILITY AND METHOD FOR DRIVING THE SAME

(71) Applicant: Samsung Display Co., Ltd., Yongin-Si (KR)

(72) Inventors: Wonjin Seo, Seoul (KR); Eunjin Choi, Yongin-si (KR); Kihyun Pyun, Gwangmyeong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/335,501

(22) Filed: Jun. 1, 2021

(65) Prior Publication Data
US 2022/0076621 A1 Mar. 10, 2022

(30) Foreign Application Priority Data
Sep. 9, 2020 (KR) .......................... 10-2020-0115462

(51) Int. Cl.
*G09G 3/3208* (2016.01)
*H01L 27/32* (2006.01)

(52) U.S. Cl.
CPC ......... *G09G 3/3208* (2013.01); *H01L 27/322* (2013.01); *H01L 27/3244* (2013.01); *G09G 2320/0233* (2013.01); *G09G 2320/0673* (2013.01); *G09G 2330/04* (2013.01); *G09G 2360/16* (2013.01)

(58) Field of Classification Search
CPC ......... G09G 3/3208; G09G 2320/0233; G09G 2320/0673; G09G 2330/04; G09G 2360/16; H01L 27/322; H01L 27/3244
See application file for complete search history.

(56) References Cited

U.S. PATENT DOCUMENTS

| | | | |
|---|---|---|---|
| 7,227,519 B1 * | 6/2007 | Kawase | ............... G09G 3/2081 345/77 |
| 9,129,556 B2 | 9/2015 | Park | |
| 9,147,360 B2 | 9/2015 | Oh et al. | |
| 9,235,125 B2 | 1/2016 | Peeters et al. | |
| 9,378,673 B2 | 6/2016 | Oh et al. | |

(Continued)

FOREIGN PATENT DOCUMENTS

| | | | |
|---|---|---|---|
| KR | 101456958 B1 | 10/2014 | |
| KR | 101492693 B1 | 2/2015 | |

(Continued)

*Primary Examiner* — Kwang-Su Yang
(74) *Attorney, Agent, or Firm* — Cantor Colburn LLP (57) ABSTRACT

An electronic device includes a display panel which includes a plurality of light emitting elements and in which a plurality of areas is defined based on the plurality of light emitting elements, a compensation unit which calculates compensation values for image data provided to each of the plurality of areas, and a control unit which controls the output of the image data provided to the display panel based on the compensation values and the image data, where the control unit may include a correction unit which outputs a correction ratio of each of the plurality of areas based on the compensation values and a comparison unit which determines whether an input current of the image data is in a normal range based on the correction ratio.

18 Claims, 6 Drawing Sheets

(56) References Cited

U.S. PATENT DOCUMENTS

| | | | |
|---|---|---|---|
| 9,396,678 B2 | 7/2016 | Hong | |
| 2015/0154912 A1* | 6/2015 | Hong | G09G 3/3225 345/77 |
| 2015/0340655 A1* | 11/2015 | Lee | H01L 51/5253 257/40 |

FOREIGN PATENT DOCUMENTS

| | | |
|---|---|---|
| KR | 102012765 B1 | 8/2019 |
| KR | 102057642 B1 | 12/2019 |
| KR | 102118078 B1 | 6/2020 |

\* cited by examiner

ELECTRONIC DEVICE WITH IMPROVED OVERCURRENT PROTECTION RELIABILITY AND METHOD FOR DRIVING THE SAME

This application claims priority to Korean Patent Application No. 10-2020-0115462, filed on Sep. 9, 2020, and all the benefits accruing therefrom under 35 U.S.C. § 119, the content of which in its entirety is herein incorporated by reference.

BACKGROUND

1. Field

Embodiments of the invention herein relate to an electronic device having improved overcurrent protection reliability and a method for driving the same.

2. Description of the Related Art

Display panels may include a transmissive display panel that selectively transmits source light generated from a light source and a light emitting display panel that generates source light in the display panel itself. The display panels may include different types of control layers according to pixels to generate color images. The control layers may transmit only a partial wavelength range of the source light or convert colors of the source light. Some control layers may change properties of light without converting the colors of the source light.

SUMMARY

Embodiments of the invention provide an electronic device having improved overcurrent protection reliability and a method for driving the same.

An embodiment of the invention provides an electronic device including a display panel having a plurality of light emitting elements and having a plurality of areas defined therein based on the plurality of light emitting elements, a compensation unit which calculates compensation values for image data provided to each of the plurality of areas, and a control unit which controls an output of the image data provided to the display panel based on the compensation values and the image data, where the control unit includes a correction unit which outputs a correction ratio of each of the plurality of areas based on the compensation values and a comparison unit which determines whether an input current of the image data is in a normal range based on the correction ratio.

In an embodiment, the correction ratio may be a ratio of an area reference current provided to an area of the plurality of areas to a reference current.

In an embodiment, the reference current may be one of area reference currents provided to the plurality of areas.

In an embodiment, the reference current may be an average value of area reference currents provided to the plurality of areas.

In an embodiment, the reference current may be a maximum value among area reference currents provided to the plurality of areas.

In an embodiment, the reference current may include a first reference current applied to a single color and a second reference current applied to a mixed color which is different from the single color.

In an embodiment, the comparison unit may determine that the input current of the image data is out of the normal range when a ratio of a value obtained by multiplying the correction ratio and the reference current to the input current of the image data is equal to or greater than a predetermined value.

In an embodiment, the control unit may further include a blocking unit which blocks the image data from being provided to the display panel when the input current of the image data is out of the normal range.

In an embodiment, the correction ratio may be determined based on a luminous efficiency of each of the plurality of areas.

In an embodiment, the display panel may include a first substrate and a second substrate disposed below the first substrate, where the first substrate may include a light control layer, and the second substrate may include the plurality of light emitting elements.

In an embodiment, the light control layer may include a first wavelength conversion layer having a first illuminant, a second wavelength conversion layer having a second illuminant, and a light transmitting layer.

In an embodiment of the invention, a method for driving an electronic device includes calculating compensation values for image data provided to each of a plurality of areas defined by a plurality of light emitting elements of a display panel, outputting a correction ratio of each of the plurality of areas based on the compensation values, and determining whether an input current of the image data is in a normal range based on the correction ratio.

In an embodiment, the outputting the correction ratio may include defining a reference current, and defining the correction ratio based on the reference current and an area reference current in the normal range provided to an area of the plurality of areas.

In an embodiment, the defining the reference current may include selecting one of area reference currents provided to the plurality of areas.

In an embodiment, the defining the reference current may include calculating an average value of area reference currents provided to the plurality of areas.

In an embodiment, the defining the reference current may include selecting a maximum value among area reference currents provided to the plurality of areas.

In an embodiment, the defining the reference current may include defining a first reference current applied to a single color and defining a second reference current applied to a mixed color which is different from the single color.

In an embodiment, the determining whether the input current of the image data is in the normal range may include determining that the input current of the image data is out of the normal range when a ratio of a value obtained by multiplying the correction ratio and the reference current to the input current of the image data is equal to or greater than a predetermined value.

In an embodiment, the method for driving an electronic device may further include blocking the image data from being provided to the display panel when the input current of the image data is out of the normal range.

In an embodiment, in the outputting the correction ratio, the correction ratio may be determined based on a luminous efficiency of each of the plurality of areas.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

In the description, when an element (or an area, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense. Terms such as "unit" may refer to a circuit or a processor, for example.

It should be understood that the terms "comprise", or "have" are intended to specify the presence of stated features, integers, steps, operations, elements, components, or combinations thereof in the invention, but do not preclude the presence or addition of one or more other features, integers, steps, operations, elements, components, or combinations thereof.

Hereinafter, embodiments of the invention will be described with reference to the accompanying drawings.

Figure 1:
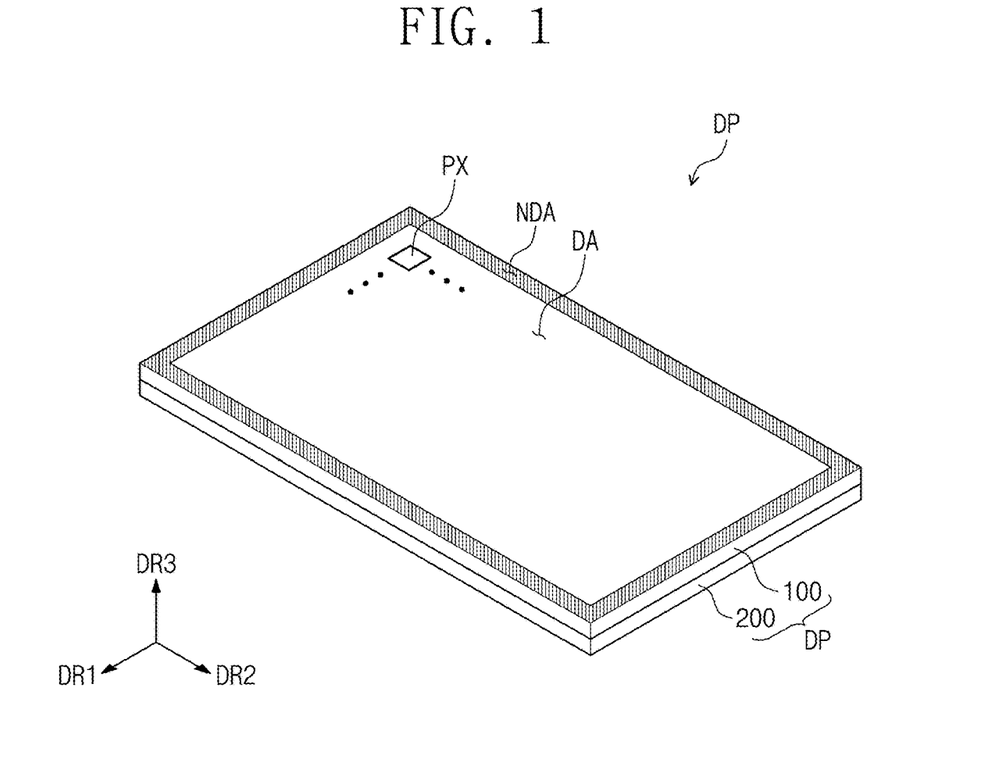
FIG. 1 is a perspective view of an embodiment of a display panel according to the invention.

FIG. 1 is a perspective view of an embodiment of a display panel according to the invention.

Referring to FIG. 1, a display area DA and a non-display area NDA may be defined in the display panel DP. The non-display area NDA may be adjacent to the display area DA.

The display area DA may be an area displaying an image. The non-display area NDA may be an area in which an image is not displayed. Pixels PX may be disposed in the display area DA. The pixels PX may not be disposed in the non-display area NDA. The pixels PX may refer to effective pixels providing images.

The display area DA may be parallel to a plane defined by a first direction DR1 and a second direction DR2. The normal direction of the display area DA, that is, the thickness direction of the display panel DP is indicated by a third direction DR3. A front surface (or an upper surface) and a rear surface (or a lower surface) of respective members may be separated by the third direction DR3. The term "in a plan view" may be defined as viewed from the third direction DR3.

The display panel DP may not only be used for large-sized display panels such as a television set, a monitor, or an outdoor billboard but also used for small- and medium-sized display panels such as a personal computer, a laptop computer, a personal digital terminal, a car navigation unit, a game console, a portable electronic device, and a camera. In addition, these are merely presented as an example, and thus it may be adopted for other display panels without departing from the inventive concept.

A bezel area of the display panel DP may be defined by the non-display area NDA. The non-display area NDA may be an area adjacent to the display area DA. The non-display area NDA may surround the display area DA. However, the invention is not limited thereto, and a shape of the display area DA and a shape of the non-display area NDA may be relatively designed. In an embodiment of the invention, the non-display area NDA may be omitted.

The display panel DP may include a first substrate 100 and a second substrate 200. The first substrate 100 may include pixel areas and a light blocking area, and the second substrate 200 may include light emitting elements. The first substrate 100 and the second substrate 200 will be described later.

Figure 2:
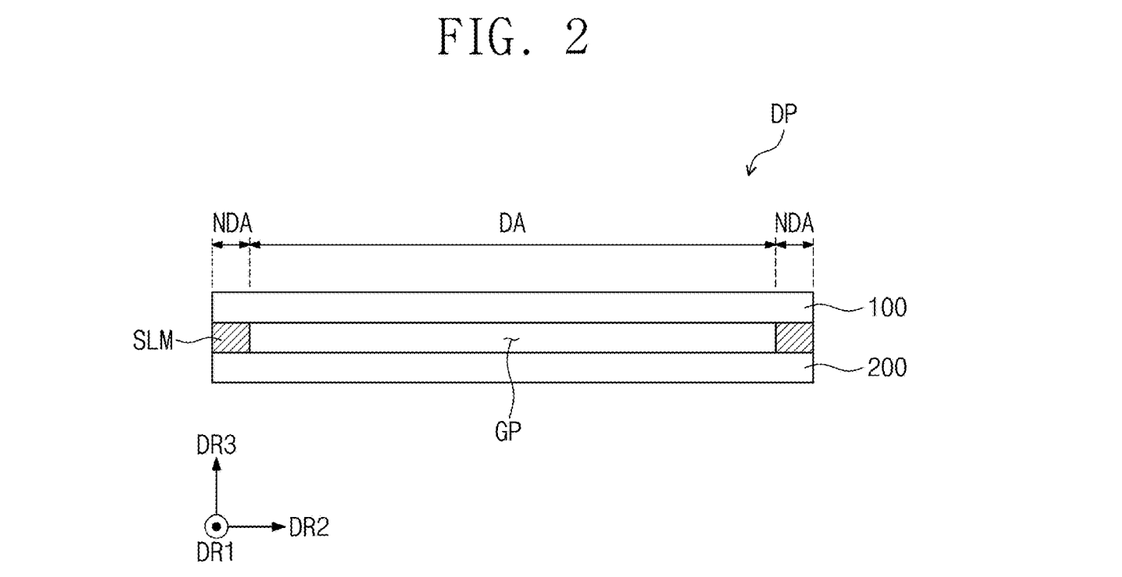
FIG. 2 is a cross-sectional view of an embodiment of a display panel according to the invention.

FIG. 2 is a cross-sectional view of an embodiment of a display panel according to the invention.

Referring to FIG. 2, the display panel DP may include a first substrate 100 and a second substrate 200. The first substrate 100 and the second substrate 200 may face each other and be spaced apart from each other. Accordingly, a predetermined cell gap GP may be provided between the first substrate 100 and the second substrate 200.

A filling layer may be disposed in the cell gap GP. The filling layer will be described later.

The cell gap GP may be maintained through a sealant SLM bonding the first substrate 100 and the second substrate 200. The sealant SLM may include an organic adhesive member or an inorganic adhesive member. In an embodiment, the sealant SLM may include frits, for example.

Figure 3:
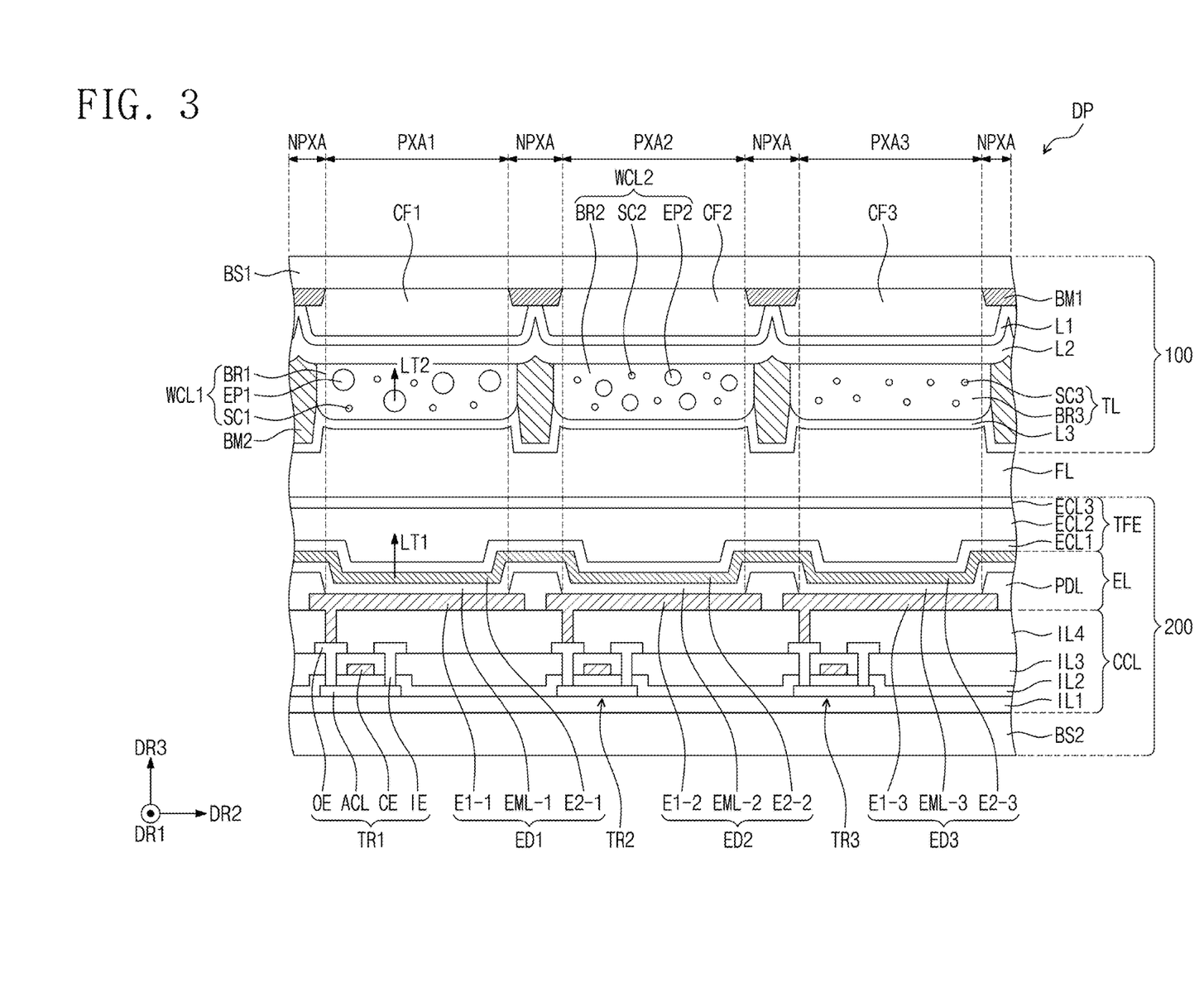
FIG. 3 is a cross-sectional view of an embodiment of a display panel according to the invention.

FIG. 3 is a cross-sectional view of an embodiment of a display panel according to the invention.

Referring to FIG. 3, first pixel areas PXA1, second pixel areas PXA2, third pixel areas PXA3, and a light blocking area NPXA may be defined in the first substrate 100 of the display panel DP. The display panel DP may provide first color light through the first pixel areas PXA1, the second pixel areas PXA2 may provide second color light, and the third pixel areas PXA3 may provide third color light. The first color light, the second color light, and the third color light each may have different colors from one another. In an embodiment, the first color light may be red light, the second color light may be green light, and the third color light may be blue light, for example.

The light blocking area NPXA may be disposed adjacent to the first pixel areas PXA1, the second pixel areas PXA2, and the third pixel areas PXA3. The light blocking area NPXA may set boundaries of the first pixel areas PXA1, the second pixel areas PXA2, and the third pixel areas PXA3. The light blocking area NPXA may prevent color mixing among the first pixel areas PXA1, the second pixel areas PXA2, and the third pixel areas PXA3. In addition, the light blocking area NPXA may prevent source light from being provided to users.

The display panel DP may be a light emitting display panel, but is not particularly limited thereto. In an embodiment, the display panel DP may be an organic light emitting display panel, a nano LED display panel, a micro LED display panel, or a quantum dot light emitting display panel, for example. An emission layer of the organic light emitting display panel may include organic light emitting materials. An emission layer of the quantum dot light emitting display panel may include quantum dots and quantum rods. Emission layers of the nano LED display panel and the micro LED display panel may include small LED elements having a size of several hundred micrometers or less. Hereinafter, the display panel DP is described as an organic light emitting display panel.

The display panel DP may include a first substrate 100, a filling layer FL, and a second substrate 200. The first substrate 100 may be a light control substrate. The second substrate 200 may be a display substrate. In an embodiment, the first substrate 100 may include a wavelength conversion material and/or a material blocking a predetermined wavelength band, for example. The second substrate 200 may provide light or control light transmittance.

The first substrate 100 and the second substrate 200 may face each other. The filling layer FL may be disposed between the first substrate 100 and the second substrate 200. The filling layer FL may fill the cell gap GP (refer to FIG. 2) between the first substrate 100 and the second substrate 200.

The first substrate 100 may include a base layer BS1, color filter layers CF1, CF2, and CF3, a light blocking layer BM1, light control layers WCL1, WCL2, and TL, and a plurality of barrier ribs BM2.

In an embodiment, the base layer BS1 may be a silicon substrate, a plastic substrate, a glass substrate, an insulating film, or a laminate structure including a plurality of insulating layers, for example.

The light blocking layer BM1 may be disposed on one surface of the base layer BS1. The light blocking layer BM1 may define a light blocking area NPXA. The light blocking layer BM1 may non-overlap the first pixel areas PXA1, the second pixel areas PXA2, and the third pixel areas PXA3.

The color filter layers CF1, CF2, and CF3 may include a first color filter layer CF1, a second color filter layer CF2, and a third color filter layer CF3. The first color filter layer CF1 may be disposed on one surface of the base layer BS1. The first color filter layer CF1 may be disposed below the base layer BS1. In an embodiment, the first color filter layer CF1 may be a red color filter layer, for example.

The second color filter layer CF2 may be disposed on one surface of the base layer BS1. The second color filter layer CF2 may be disposed below the base layer BS1. In an embodiment, the second color filter layer CF2 may be a green color filter layer, for example.

The third color filter layer CF3 may be disposed on one surface of the base layer BS1. The third color filter layer CF3 may be disposed below the base layer BS1. In an embodiment, the third color filter layer CF3 may be a blue color filter layer, for example.

The first color filter layer CF1 may be disposed in each of the first pixel areas PXA1. The second color filter layer CF2 may be disposed in each of the second pixel areas PXA2. The third color filter layer CF3 may be disposed in each of the third pixel areas PXA3.

A first protective layer L1 may cover the color filter layers CF1, CF2, and CF3, and the light blocking layer BM1. The first protective layer L1 may include an inorganic material. In an embodiment, the inorganic material may include any one among silicon oxide, silicon nitride, or silicon oxy nitride, for example.

A second protective layer L2 may be disposed below the first protective layer L1. The second protective layer L2 may include an inorganic material. In an embodiment, the inorganic material may include any one among silicon oxide, silicon nitride, or silicon oxy nitride, for example.

Light control layers WCL1, WCL2, and TL may include a first light control layer WCL1, a second light control layer WCL2, and a third light control layer TL. The light control layers WCL1, WCL2, and TL may be disposed below the second protective layer L2.

The first light control layer WCL1 may be disposed below the first color filter layer CF1. The first light control layer WCL1 may be disposed in the first pixel area PXA1. The first light control layer WCL1 may include a first base resin BR1, first scattering particles SC1, and a first illuminant EP1.

The second light control layer WCL2 may be disposed below the second color filter layer CF2. The second light control layer WCL2 may be disposed in the second pixel area PXA2. The second light control layer WCL2 may include a second base resin BR2, second scattering particles SC2, and a second illuminant EP2.

The third light control layer TL may be disposed below the third color filter layer CF3. The third light control layer TL may be disposed in the third pixel area PXA3. The third light control layer TL may include a third base resin BR3 and third scattering particles SC3.

The first to third base resins BR1, BR2, and BR3 are media in which luminous bodies or scattering particles are dispersed, and may include various resin compositions, which may be generally referred to as a binder. However, the invention is not limited thereto, and as long as the media are capable of dispersing luminous bodies or scattering particles, the media may be also referred to as a base resin regardless of names, additional functions, constituent materials, etc. The base resin may be a polymer resin. In an embodiment, the base resin may be an acrylic-based resin, a urethane-based resin, a silicone-based resin, an epoxy-based resin, etc. The base resin may be a transparent resin, for example.

The first to third scattering particles SC1, SC2, and SC3 may be $TiO_2$ or silica-based nanoparticles. The first to third scattering particles SC1, SC2, and SC3 may scatter light. Due to the lack of an illuminant in the third light control layer TL, the amount of the third scattering particles SC3 included in the third light control layer TL may be equal to or greater than that of the amount of each of the first scattering particles SC1 included in the first light control layer WCL1 and second scattering particles SC2 included in the second light control layer WCL2. In another embodiment of the invention, the first and second scattering particles SC1 and SC2 may be omitted.

Each of the first illuminant EP1 and the second illuminant EP2 may be particles converting wavelengths of light. In an embodiment, each of the first illuminant EP1 and the second illuminant EP2 may be a quantum dot, a quantum rod, or a phosphor, for example.

A quantum dot has a crystalline structure of a few nanometers in size, includes hundreds to thousands of atoms, and exhibits a quantum confinement effect in which an energy band gap is increased due to its small size. When light of a wavelength having higher energy than that of the band gap is incident on the quantum dot, the quantum dot absorbs the light to be excited, and falls to a ground state while emitting light of a predetermined wavelength. The emitted light of the predetermined wavelength has a value corresponding to the band gap. When the quantum dot is adjusted in size and composition, light emitting properties due to the quantum confinement effect may be controlled.

The core of the quantum dot may include a Group II-VI compound, a Group III-VI compound, a Group compound, a Group III-V compound, a Group IV-VI compound, a Group IV element, a Group IV compound, or a combination thereof.

In an embodiment, the Group II-VI compound may include a binary compound including at least one of CdSe, CdTe, CdS, ZnS, ZnSe, ZnTe, ZnO, HgS, HgSe, HgTe, MgSe, MgS, and a combination thereof, a ternary compound including at least one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary compound including at least one of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

In an embodiment, the Group III-VI compound may include a binary compound such as $In_2S_3$ and $In_2Se_3$, a ternary compound such as $InGaS_3$ and $InGaSe_3$, or any combination thereof.

In an embodiment, the Group semiconductor compound may include a ternary compound including $AgInS$, $AgInS_2$, $CuInS$, $CuInS_2$, $AgGaS_2$, $CuGaS_2$ $CuGaO_2$, $AgGaO_2$, $AgAlO_2$, or a combination thereof, or a quaternary compound such as $AgInGaS_2$ and $CuInGaS_2$.

In an embodiment, the Group III-V compound may include a binary compound including at least one of GaN, GaP, GaAs, GaSb, AlN, AlP, AlAs, AlSb, InN, InP, InAs, InSb, and a combination thereof, a ternary compound including at least one of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and a quaternary compound including at least one of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. In an embodiment, the Group III-V compound may further include a Group II metal. In an embodiment, a Group III-II-V compound may include InZnP, etc.

In an embodiment, the Group IV-VI compound may include a binary compound including at least one of SnS, SnSe, SnTe, PbS, PbSe, PbTe, and a combination thereof, a ternary compound including at least one of SnSeS, SnSeTe, SnSTe, PbSeS, PbSeTe, PbSTe, SnPbS, SnPbSe, SnPbTe, and a combination thereof, and a quaternary compound including at least one of SnPbSSe, SnPbSeTe, SnPbSTe, and a combination thereof. In an embodiment, the Group IV element may include at least one of Si, Ge, and a combination thereof. In an embodiment, the Group IV compound may be a binary compound including at least one of SiC, SiGe, and a combination thereof.

In this case, a binary compound, a ternary compound, or a quaternary compound may be in particles with a uniform concentration, or may be in the same particle with a partially different concentration. In addition, the quantum dot may have a core/shell structure in which one quantum dot surrounds another quantum dot. An interface between a core and a shell may have a concentration gradient in which the concentration of an element in the shell becomes lower towards the center.

In some embodiments, a quantum dot may have the core/shell structure including a core having nano-crystals and a shell surrounding the core described above. The shell of the quantum dot may serve as a protection layer to prevent the chemical deformation of the core so as to maintain semiconductor properties, and/or a charging layer to impart electrophoresis properties to the quantum dot. The shell may be a single layer or a multilayer. An interface between the core and the shell may have a concentration gradient in which the concentration of an element in the shell becomes lower towards the center. An embodiment of the quantum dot shell may include a metal or non-metal oxide, a semiconductor compound, or any combinations thereof.

In an embodiment, the metal or non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$ but the invention is not limited thereto.

In an embodiment, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the invention is not limited thereto.

In an embodiment, a quantum dot may have a full width of half maximum ("FWHM") of a light emitting wavelength spectrum of about 45 nanometers (nm) or less, preferably about 40 nm or less, more preferably about 30 nm or less, and color purity or color reproducibility may be improved in the above range. In addition, light emitted through such a quantum dot is emitted in all directions so that a wide viewing angle may be improved.

In addition, the form of a quantum dot is not particularly limited as long as it is a form commonly used in the art, and more specifically, a quantum dot which is a spherical, pyramidal, or multi-arm type, or in the form of cubic nanoparticles, nanotubes, nanowires, nanofibers, nanoparticles, etc., may be used.

A quantum dot may control the colors of emitted light according to a particle size thereof and the quantum dot may thus have various light emitting colors such as blue, red, green, etc. In an embodiment of the invention, when the first illuminant EP1 and the second illuminant EP2 are quantum dots, the particle size of the first illuminant EP1 and the particle size of the second illuminant EP2 may be different from each other. In an embodiment, the particle size of the first illuminant EP1 may be greater than the particle size of the second illuminant EP2, for example. In this case, the first illuminant EP1 may emit light having a longer wavelength than that of the second illuminant EP2.

The first light control layer WCL1 may convert blue light into red light to provide the converted light to the first color filter layer CF1. The first color filter layer CF1 may transmit light in a wavelength range of red light, and absorb other light.

The second light control layer WCL2 may convert blue light into green light to provide the converted light to the second color filter layer CF2. The second color filter layer CF2 may transmit light in a wavelength range of green light, and absorb other light.

The third light control layer TL may scatter blue light to provide the scattered light to the third color filter layer CF3. The third color filter layer CF3 may transmit light in a wavelength range of blue light, and absorb other light.

The third protective layer L3 may be disposed below the light control layers WCL1, WCL2, and TL. The third protective layer L3 may cover the light control layers WCL1, WCL2, and TL. In an embodiment, the third protective layer L3 may include any one among silicon oxide, silicon nitride, or silicon oxy nitride, for example. In another embodiment of the invention, the third protective layer L3 may be omitted.

A plurality of barrier ribs BM2 may be spaced apart with the light control layers WCL1, WCL2, and TL therebetween. The plurality of barrier ribs BM2 may overlap the light blocking layer BM1.

The second substrate 200 may include a base layer BS2, a circuit layer CCL, a light emitting element layer EL, and a thin film encapsulation layer TFE. The circuit layer CCL may be disposed on the base layer BS2. The circuit layer CCL may include a plurality of insulating layers, a plurality of conductive layers, and a semiconductor layer. The light emitting element layer EL may be disposed on the circuit layer CCL. The thin film encapsulation layer TFE may seal the light emitting element layer EL. In an embodiment of the invention, the thin film encapsulation layer TFE may be omitted.

The base layer BS2 may be a silicon substrate, a plastic substrate, a glass substrate, an insulating film, or a laminate structure including a plurality of insulating layers.

The circuit layer CCL may include first to third transistors TR1, TR2, and TR3, and a plurality of insulating layers ILL IL2, IL3, and IL4. The plurality of insulating layers IL1, IL2, IL3, and IL4 may include a first insulating layer IL1, a second insulating layer IL2, a third insulating layer IL3, and a fourth insulating layer IL4.

The first insulating layer IL1 may be disposed on the base layer BS2, and the first to third transistors TR1, TR2, and TR3 may be disposed on the first insulating layer IL1. The first to third transistors TR1, TR2, and TR3 may have substantially the same structure. Therefore, the first transistor TR1 is described as a representative. The first transistor TR1 may include a control electrode CE, an input electrode IE, an output electrode OE, and a semiconductor layer ACL.

The semiconductor layer ACL may be disposed on the first insulating layer IL1. The first insulating layer IL1 may be a buffer layer providing a modified surface to the semiconductor layer ACL. In this case, the semiconductor layer ACL may have higher adhesion to the first insulating layer IL1 than to the base layer BS2. In addition, the first insulating layer IL1 may protect a lower surface of the semiconductor layer ACL. In this case, the first insulating layer IL1 may prevent the base layer BL2 itself, or contamination or moisture introduced through the base layer BL2 from penetrating into the semiconductor layer ACL. In an alternative embodiment, the first insulating layer IL1 may be a light blocking layer blocking external light incident through the base layer BS2 from entering the semiconductor layer ACL. In this case, the first insulating layer IL1 may further include a light blocking material.

In an embodiment, the semiconductor layer ACL may include polysilicon, for example. However, the invention is not limited thereto, and the semiconductor layer ACL may include amorphous silicon, low-temperature polycrystalline silicon, or an oxide semiconductor. The semiconductor layer ACL may include a first area having high conductivity and a second area having low conductivity.

The first area may be doped with an N-type dopant or a P-type dopant. A P-type transistor may include a doped area doped with the P-type dopant, and an N-type transistor may include a doped area doped with the N-type dopant. The second area may be a non-doped area or may be doped in a lower concentration than that of the first area.

The first area has greater conductivity than that of the second area, and may substantially serve as an electrode or a signal line. The second area may substantially correspond to an active (or a channel) of the transistor. That is, a portion of a semiconductor pattern may be an active of the transistor, another portion may be a source or drain of the transistor, and the other portion may be a connection electrode or a connection signal line.

The second insulating layer IL2 may be disposed on the first insulating layer IL1. The second insulating layer IL2 may cover the semiconductor layer ACL. The second insulating layer IL2 may include an inorganic material. In an embodiment, the inorganic material may include at least any one among silicon nitride, silicon oxy nitride, silicon oxide, titanium oxide, and aluminum oxide, for example.

The control electrode CE may be disposed on the second insulating layer IL2. The third insulating layer IL3 may be disposed on the second insulating layer IL2, and may cover the control electrode CE. The third insulating layer IL3 may be disposed on the second insulating layer IL2, and may cover the control electrode CE. The third insulating layer IL3 may include a single layer or a plurality of layers. In an embodiment, the single layer may include an inorganic layer, for example. The plurality of layers may include an organic layer and an inorganic layer.

The input electrode IE and the output electrode OE may be disposed on the third insulating layer IL3. The input electrode IE and the output electrode OE may be connected to the semiconductor layer ACL via through holes passing through the second insulating layer IL2 and the third insulating layer IL3.

The fourth insulating layer IL4 may be disposed on the third insulating layer IL3, and cover the input electrode IE and the output electrode OE. The fourth insulating layer IL4 may include a single layer or a plurality of layers. In an embodiment, the single layer may include an organic layer, for example. The plurality of layers may include an organic layer and an inorganic layer. The fourth insulating layer IL4 may be a planarization layer providing a flat surface on an upper portion.

The light emitting element layer EL may be disposed on the fourth insulating layer IL4. The light emitting element layer EL may include light emitting elements ED1, ED2 and ED3, and a pixel defining film PDL.

The light emitting elements ED1, ED2, and ED3 may overlap a first opening HA1 the color filter layers CF1, CF2, and CF3, and the light control layers WCL1, WCL2, and TL, respectively. The light emitting elements ED1, ED2, and ED3 may include a first light emitting element ED1, a second light emitting element ED2, and a third light emitting element ED3.

The first light emitting element ED1 may be disposed corresponding to the first pixel area PXA1. The first light emitting element ED1 may overlap the first pixel area PXA1 in a plan view. The first light emitting element ED1 may include a first electrode E1-1, a first emission layer EML-1, and a second electrode E2-1.

The second light emitting element ED2 may be disposed corresponding to the second pixel area PXA2. The second light emitting element ED2 may overlap the second pixel area PXA2 in a plan view. The second light emitting element ED2 may include a first electrode E1-2, a second emission layer EML-2, and a second electrode E2-2.

The third light emitting element ED3 may be disposed corresponding to the third pixel area PXA3. The third light emitting element ED3 may overlap the third pixel area PXA3 in a plan view. The third light emitting element ED3 may include a first electrode E1-3, a third emission layer EML-3, and a second electrode E2-3.

The first electrodes E1-1, E1-2, and E1-3 may be disposed on the fourth insulating layer IL4. The first electrodes E1-1, E1-2, and E1-3 may be electrically connected to the first to third transistors TR1, TR2, and TR3, respectively, via through holes.

The pixel defining film PDL may expose at least portions of each of the first electrodes E1-1, E1-2, and E1-3. The pixel defining film PDL may overlap a plurality of barrier ribs BM2. The pixel defining film PDL may overlap a light blocking layer BM1.

The first to third emission layers EML-1, EML-2, and EML-3 in an embodiment of the invention may be connected to one another to form one emission layer. In an embodiment, the first to third emission layers EML-1, EML-2, and EML-3 may be disposed on the pixel defining film PDL and the first electrodes E1-1, E1-2, and E1-3, for example. The first to third emission layers EML-1, EML-2, and EML-3 may generate blue light. The first to third emission layers EML-1, EML-2, and EML-3 may have a tandem structure or a single-layer structure.

The second electrodes E2-1, E2-2, and E2-3 may be connected to one another to form one second electrode. The second electrodes E2-1, E2-2, and E2-3 may be disposed on the first to third emission layers EML-1, EML-2, and EML-3.

Although not separately illustrated, a hole control layer may be disposed between the first electrode and the emission layer, and an electron control layer may be disposed between the emission layer and the second electrode. The hole control layer may be classified as at least one among a hole injection region, a hole transport region, a buffer region, and an electron blocking region. The electron control layer may be classified as at least one among an electron injection region, an electron transport region, and a hole blocking region.

The thin film encapsulation layer TFE may be disposed on the second electrodes E2-1, E2-2, and E2-3. The thin film encapsulation layer TFE may directly cover the second electrodes E2-1, E2-2, and E2-3. In another embodiment of the invention, a capping layer covering the second electrodes E2-1, E2-2, and E2-3 may be further disposed between the thin film encapsulation layer TFE and the second electrodes E2-1, E2-2, and E2-3. In another embodiment of the invention, the thin film encapsulation layer TFE may be omitted.

The thin film encapsulation layer TFE may include a first inorganic layer ECL1, an organic layer ECL2, and a second inorganic layer ECL3, which are sequentially stacked. The organic layer ECL2 may be disposed between the first inorganic layer ECL1 and the second inorganic layer ECL3. The first inorganic layer ECL1 and the second inorganic layer ECL3 may be provided by depositing an inorganic material, and the organic layer ECL2 may be provided through depositing, printing, or coating an organic material.

The first inorganic layer ECL1 and the second inorganic layer ECL3 protect the light emitting element layer EL from moisture and oxygen, and the organic layer ECL2 protects the light emitting element layer EL from foreign substances such as dust particles. In an embodiment, the first inorganic layer ECL1 and the second inorganic layer ECL3 may include at least any one among silicon nitride, silicon oxynitride, silicon oxide, titanium oxide, and aluminum oxide, for example. In an embodiment, the organic layer ECL2 may include a polymer, for example, an acrylic-based organic layer, for example. However, this is presented as an example, and is not limited thereto.

In FIG. 3, the thin film encapsulation layer TFE is illustrated to include two inorganic layers and one organic layer as an example, but is not limited thereto. In an embodiment, the thin film encapsulation layer TFE may include three inorganic layers and two organic layers, and in this case, the inorganic layer and the organic layer may have a structure of being alternately stacked, for example. Further, the thin film encapsulation layer TFE may be provided as a single layer.

The filling layer FL may be disposed between a lower surface of each of the third protective layer L3 and the plurality of barrier ribs BM2, and an upper surface of the second inorganic layer ECL3. The filling layer FL may be disposed between the thin film encapsulation layer TFE and the light control layers WCL1, WCL2, and TL to prevent the light control layers WCL1, WCL2, and TL from contacting the thin film encapsulation layer TFE, thereby improving light output efficiency of the display panel DP. The filling layer FL may be disposed between the thin film encapsulation layer TFE and the light control layers WCL1, WCL2, and TL to prevent an inner space from being created between the thin film encapsulation layer TFE and the light control layers WCL1, WCL2, and TL.

The filling layer FL may prevent luminous bodies and/or scattering particles included in the light control layers WCL1, WCL2, and TL from being oxidized due to internal air, and thus increasing light output efficiency of the display panel DP.

In an embodiment, the filling layer FL may include an inorganic binder, an organic binder, or a liquid crystal compound, for example. However, this is presented as an example, and the material of the filling layer FL of the invention is not limited thereto.

The display panel DP may be manufactured by bonding a first substrate 100, a filling layer FL, and a second substrate 200.

The light emitting elements ED1, ED2, and ED3 may provide first light LT1 to the first substrate 100. In an embodiment, the first light LT1 may be blue light, for example. The first light LT1 may be also referred to as source light. The first light LT1 may be provided to the light control layers WCL1, WCL2, and TL.

The first light LT1 passing through the light control layers WCL1, WCL2, and TL may be defined as second light LT2. The second light LT2 may include light in which the first light LT1 is converted by the illuminants (also referred to as luminous bodies) EP1 and EP2, and the first light LT1. In an embodiment, the second light LT2 may include at least one among red light, green light, and blue light, for example. The second light LT2 may be provided to the color filter layers CF1, CF2, and CF3.

The second light LT2 passing through the first light control layer WCL1 may include red light and blue light. When the second light LT2 is provided to the first color filter CF1, the blue light may be absorbed to display red light.

The second light LT2 passing through the second light control layer WCL2 may include green light and blue light. When the second light LT2 is provided to the second color filter CF2, the blue light may be absorbed to display green light.

Figure 4:
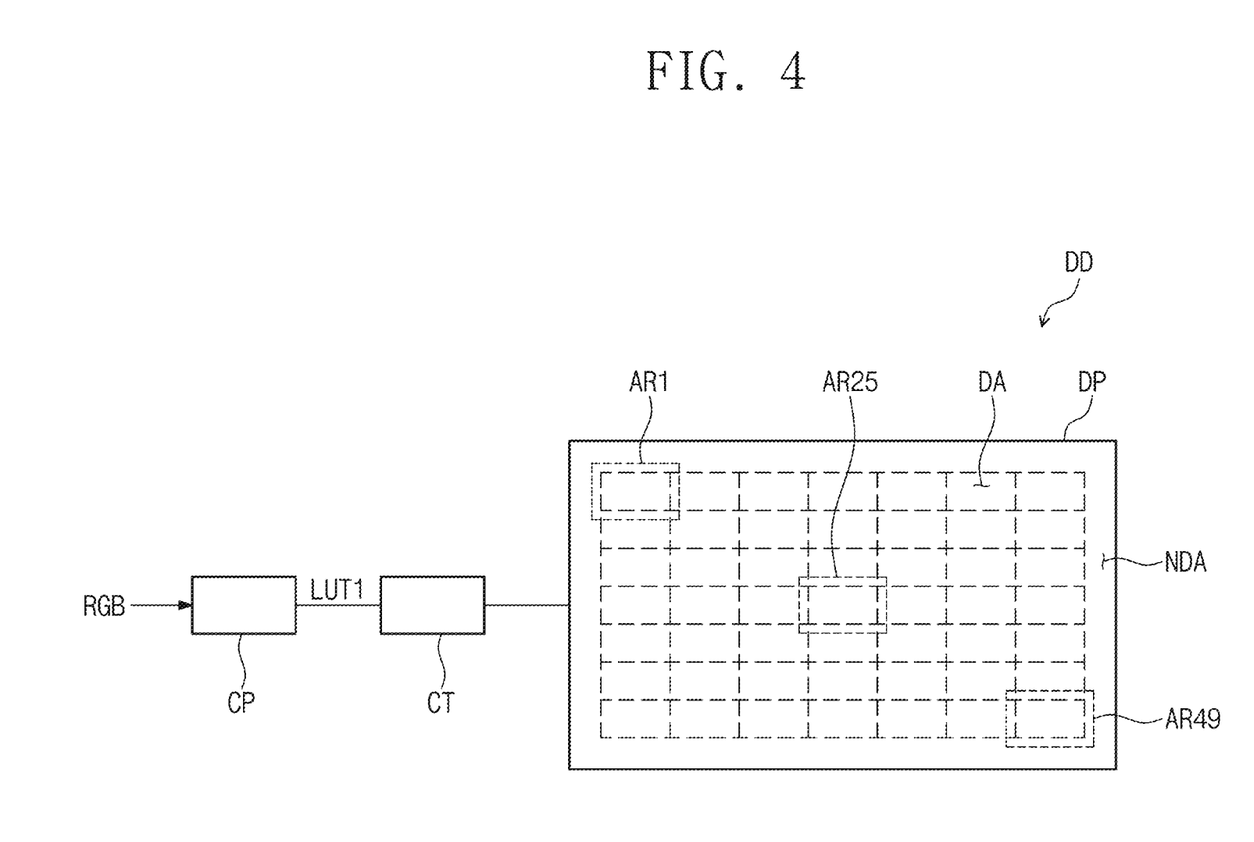
FIG. 4 illustrates an embodiment of an electronic device according to the invention.

FIG. 4 illustrates an embodiment of an electronic device according to the invention.

Referring to FIGS. 3 and 4, an electronic device DD may include a display panel DP, a compensation unit CP, and a control unit CT.

A plurality of light emitting elements ED1, ED2, and ED3 may be disposed in the display area DA. Each of a plurality of areas AR1 to AR49 may be defined based on the plurality of light emitting elements ED1, ED2, and ED3. In an alternative embodiment, each of the plurality of areas AR1 to AR49 may be defined based on the plurality of pixel areas PXA1, PXA2, and PXA3. FIG. 4 illustrates the display area DA in which forty-nine areas are defined as an example, but is not particularly limited thereto. In addition, although FIG. 4 illustrates that each of the plurality of areas AR1 to AR49 is the same in size, it is not limited thereto. In an embodiment, each of the plurality of areas AR1 to AR49 may be different in size from one another, for example. The plurality of light emitting elements may not be disposed in the non-display area NDA.

In an embodiment, the compensation unit CP and the control unit CT may be electrically connected to the display panel DP in the form of a chip on flexible printed circuit ("COF"), a chip on glass ("COG"), or a flexible printed circuit ("FPC"), for example.

The compensation unit CP may receive image data RGB provided from the outside. The compensation unit CP may calculate a compensation value LUT1 for the image data RGB provided to each of the plurality of areas AR1 to AR49. The compensation value LUT1 will be described later.

The control unit CT may control the output of the image data RGB provided to the display panel DP based on the compensation value LUT1 and the image data RGB. A method for driving the control unit CT will be described later.

Figure 5:
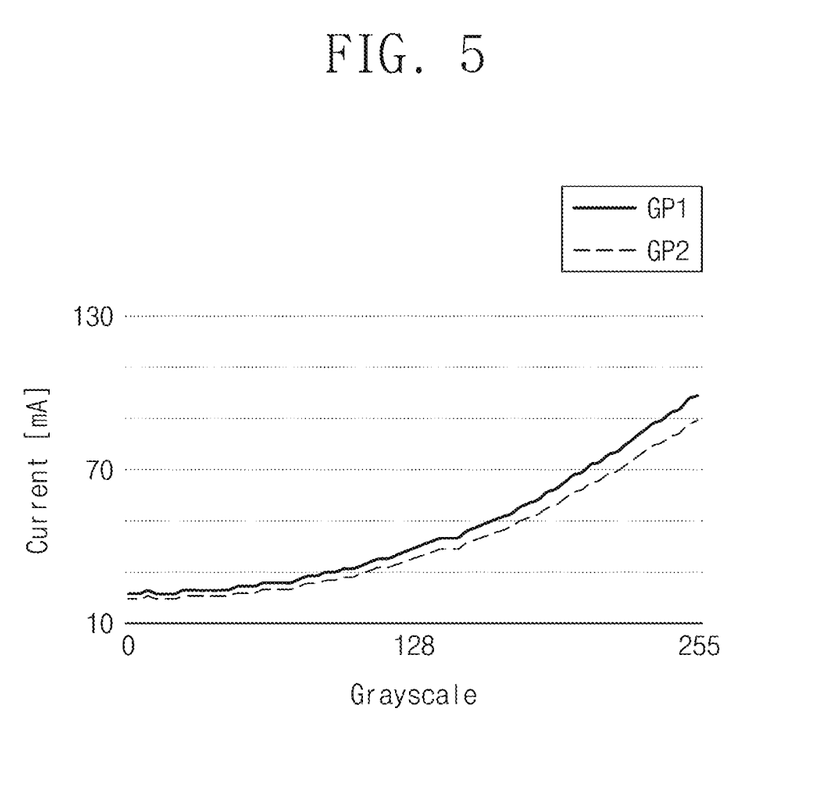
FIG. 5 is a graph of an embodiment of currents according to gray scale levels according to the invention.

FIG. 5 is a graph of an embodiment of currents according to gray scale levels according to the invention.

Referring to FIGS. 4 and 5, a horizontal axis of the graph may refer to gray scale levels. The gray scale levels may refer to gray scale. The gray scale may have a value of about 0 to about 255. In an embodiment, the gray scale of 0 may indicate the darkest state, and the gray scale of 255 may indicate the brightest state. A vertical axis of the graph may refer to currents, for example.

Currents desired to express the same gray scale level of each of the plurality of areas AR1 to AR49 may be different from one another. Accordingly, current efficiency may be different from one another according to respective areas of the display area DA.

In the graph of FIG. 5, only a first graph GP1 and a second graph GP2 are illustrated as an example. The first graph GP1 is a graph of currents according to the gray scale levels of the first area AR1 among the plurality of areas AR1 to AR49, and the second graph GP2 is a graph of currents according to the gray scale levels of the 25th area AR25 among the plurality of areas AR1 to AR49.

The plurality of areas AR1 to AR49 each may have different currents for providing target luminance. In an embodiment, a current for providing the target luminance to the first area AR1 may be greater than a current for providing the target luminance to the 25th area AR25, for example. In an embodiment, the target luminance may be 500 nits. In this case, the current of the first area AR1 may be about 88.6 milliamperes (mA), and the current of the 25th area AR25 may be about 80.5 mA, for example.

Figure 6:
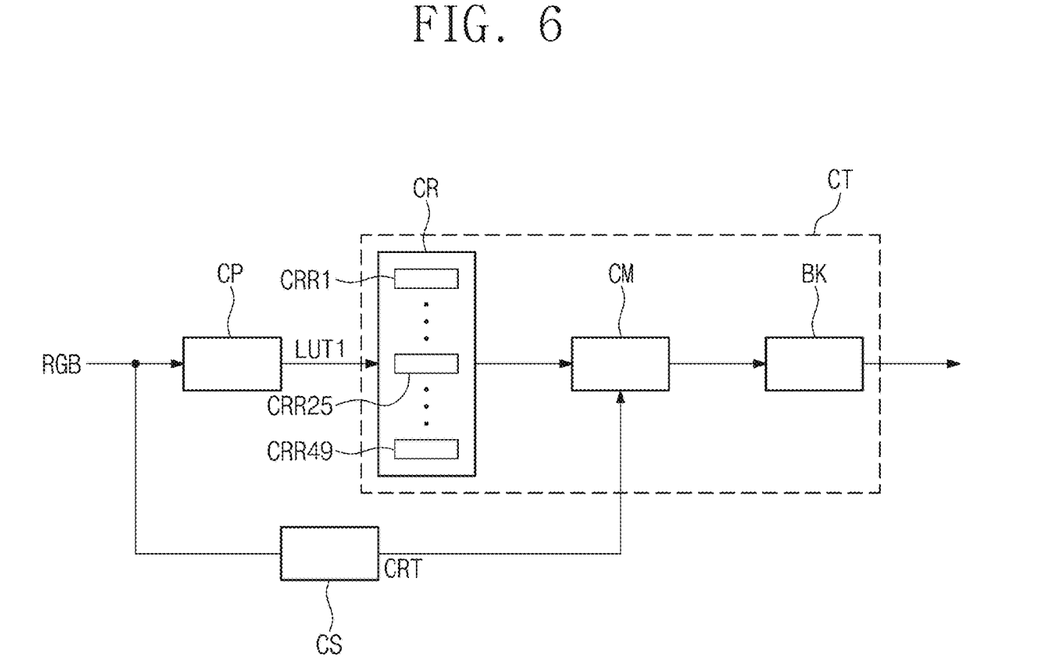
FIG. 6 is a block diagram showing an embodiment of a compensation unit and a control unit according to the invention.
Figure 7:
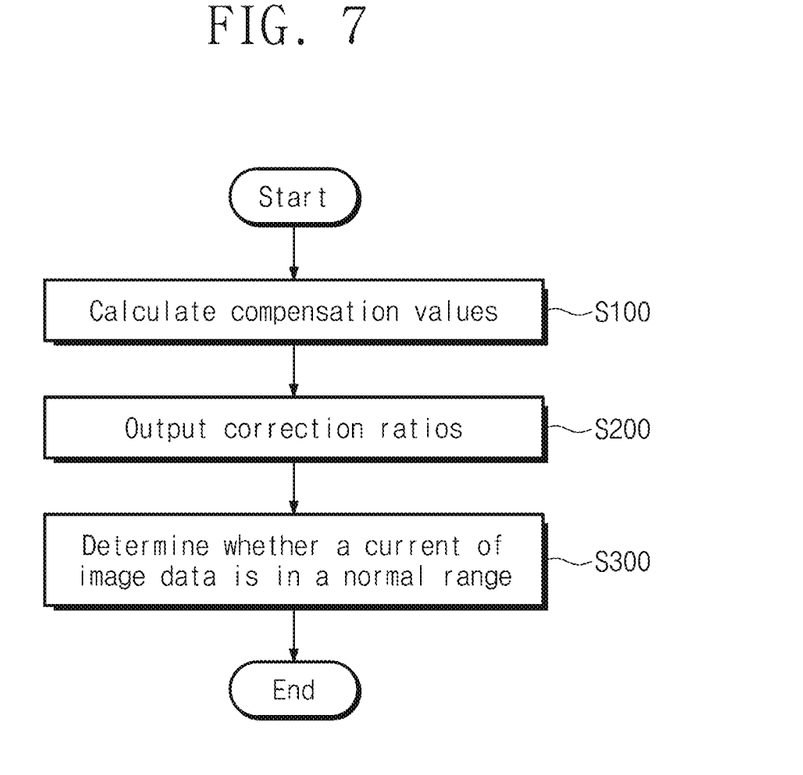
FIG. 7 is a flowchart showing an embodiment of a method for driving an electronic device according to the invention.

FIG. 6 is a block diagram showing an embodiment of a compensation unit and a control unit according to the invention, and FIG. 7 is a flowchart illustrating an embodiment of a method for driving an electronic device according to the invention.

Referring to FIGS. 4 to 7, the compensation unit CP may measure chromaticity and luminance of images displayed in each of the plurality of areas AR1 to AR49.

The compensation unit CP may calculate color coordinates based on the measured chromaticity. The compensation unit CP may set reference color coordinate offset values capable of compensating for chromaticity corresponding to the color coordinates. In an embodiment, the compensation unit CP may set color coordinate movement values capable of compensating for color coordinates distorted due to problems in processes as reference color coordinate movement values, for example.

The compensation unit CP may calculate a luminance difference between a predetermined target luminance and measured luminance based on the measured luminance. The compensation unit (also referred to as compensator) CP may set reference luminance offset values capable of compensating for luminance in response to the luminance difference. In an embodiment, the compensation unit CP may set gamma control values capable of compensating for the luminance difference as reference luminance offset values, for example.

The compensation unit CP may calculate a compensation value LUT1 corresponding to a luminance difference and/or a color coordinate of each of the plurality of areas AR1 to AR49 (S100). The compensation value LUT1 may be stored in the form of a look-up table ("LUT"). The number of areas AR1 to AR49 may be the same as the number of compensation value LUT1. In an embodiment, chromaticity correction, along with luminance correction, may be performed through the compensation value LUT1, for example. However, the operation of the compensation unit CP of the invention is not limited thereto. In an embodiment, after the luminance correction is performed, according to the luminance correction results, screen analysis is carried out and then the color coordinates may be controlled, for example.

The control unit CT may include a correction unit CR, a comparison unit CM, and a blocking unit BK.

The plurality of areas AR1 to AR49 may be calculated based on the compensation value LUT1, and the correction unit CR may output correction ratios CRR1 to CRR49 corresponding to each of the plurality of areas AR1 to AR49 (S200). Each of the plurality of correction ratios CRR1 to CRR49 may be stored in the form of an LUT. The number of the plurality of areas AR1 to AR49 may be the same as the number of correction ratios CRR1 to CRR49.

The plurality of correction ratios CRR1 to CRR49 may be determined based on the luminous efficiency of the plurality of areas AR1 to AR49, respectively. Each of the plurality of correction ratios CRR1 to CRR49 may be a ratio or weight of as area reference current provided to each of the plurality of areas AR1 to AR49 with respect to the reference current. The area reference current may be a current of image data RGB included in a normal range.

The reference current may be one of area reference currents provided to the plurality of areas AR1 to AR49. In an embodiment, the reference current may be a current of the 25th area AR25, for example. In an embodiment, in the normal state, the 25th area AR25 may have a current of about 80.5 mA, for example. A correction ratio CRR25 of the 25th area AR25 may be about 1.0. In the normal state, the first area AR1 may have a current of about 88.6 mA, and a correction ratio CRR1 of the first area AR1 may be about 1.1. In addition, in the normal state, the 49th area AR49 may have a current of about 74.0 mA, and a correction ratio CRR49 of the 49th area AR49 may be about 0.92.

However, this is presented as an example, and the reference current of the invention is not limited thereto. In an embodiment, the reference current may be an average value of the are reference currents provided to the plurality of areas AR1 to AR49, and the reference current may be a maximum value or a minimum value among the area reference currents provided to the plurality of areas AR1 to AR49, for example.

Each of the plurality of correction ratios CRR1 to CRR49 may have a different value according to a single color or a mixed color. The mixed color may be different from the single color. In an embodiment, the single color may include red, blue, and green, and the mixed color may include white, for example. In this case, the reference current may include a first reference current applied to the single color and a second reference current applied to the mixed color.

A current sensor CS may output an input current CRT provided to the display panel DP in real time based on the image data RGB.

The comparison unit CM may determine whether the input current CRT of the image data RGB is in a normal range based on the plurality of correction ratios CRR1 to CRR49 (S300). The comparison unit CM may determine that the input current CRT of the image data RGB is in the normal range when a ratio of a value obtained by multiplying the correction ratios CRR1 to CRR49 of each of the plurality of areas AR1 to AR49 and the reference current to the input current CRT of the image data RGB is equal to or greater than a predetermined value, whereas the input current CRT of the image data RGB is out of the normal range when the ratio is less than a predetermined value.

When the input current CRT of the image data RGB is out of the normal range, the blocking unit BK may block the image data RGB from being provided to the display panel DP.

Currents desired to express the same gray scale level of each of the plurality of areas AR1 to AR49 may be different from one another. According to the embodiment of the invention, the control unit CT may determine whether the input current CRT of the image data RGB provided to each of the plurality of areas AR1 to AR49 is in the normal range based on the current efficiency of each of the plurality of areas AR1 to AR49.

In addition, in the embodiment of the invention, the control unit CT may respectively output the plurality of correction ratios CRR1 to CRR49 in correspondence to the plurality of areas AR1 to AR49. The control unit CT may determine whether the input current CRT of the image data RGB is in the normal range based on the plurality of correction ratios CRR1 to CRR49. When the input current CRT of the image data RGB is out of the normal range, the control unit CT may block the image data RGB from being provided to the display panel DP. In an embodiment, a current out of the normal range may be an overcurrent, for example. Accordingly, the control unit CT may prevent circuits of the display panel DP from being damaged due to the overcurrent.

In addition, in the embodiment of the invention, the control unit CT may detect the input current CRT of the image data RGB provided to the display panel DP in real time, and determine whether the input current CRT is in the normal range. When the input current CRT of the image data RGB is out of the normal range, the control unit CT may block the image data RGB from being provided to the display panel DP. Accordingly, the control unit CT may prevent the damage to the display panel DP, which may be caused during driving.

According to invention, an electronic device may include a display panel and a control unit. The control unit may respectively output a plurality of correction ratios in correspondence to a plurality of areas defined on the display panel. The control unit may determine whether an input current of image data is in a normal range based on the plurality of correction ratios. When the input current of the image data is out of the normal range, the control unit may block the image data from being provided to the display panel. In an embodiment, a current out of the normal range may be an overcurrent, for example. Therefore, the control unit may prevent circuits of the display panel from being damaged due to the overcurrent.

Although the invention has been described with reference to a preferred embodiment of the invention, it will be understood that the invention should not be limited to these preferred embodiments but various changes and modifications may be made by those skilled in the art without departing from the spirit and scope of the inventive concept.

Accordingly, the technical scope of the invention is not intended to be limited to the contents set forth in the detailed description of the specification, but is intended to be defined by the appended claims.

What is claimed is:

1. An electronic device comprising:
    a display panel including a plurality of light emitting elements and having a plurality of areas defined therein based on the plurality of light emitting elements;
    a compensation circuit which calculates compensation values for image data provided to each of the plurality of areas; and
    a control circuit which controls an output of the image data provided to the display panel based on the compensation values and the image data, the control circuit including:
        a correction circuit which outputs a correction ratio of each of the plurality of areas based on the compensation values; and
        a comparison circuit which determines whether an input current of the image data is in a normal range based on the correction ratio, the correction ratio is a ratio of an area reference current provided to an area of the plurality of areas to a reference current, and wherein the correction ratio of the area of the plurality of areas has a first value for a single color and has a second value different from the first value for a mixed color which is different from the single color.

2. The electronic device of claim 1, wherein the reference current is one of area reference currents provided to the plurality of areas.

3. The electronic device of claim 1, wherein the reference current is an average value of area reference currents provided to the plurality of areas.

4. The electronic device of claim 1, wherein the reference current is a maximum value among area reference currents provided to the plurality of areas.

5. The electronic device of claim 1, wherein the reference current comprises a first reference current applied to the single color and a second reference current applied to the mixed color which is different from the single color.

6. The electronic device of claim 1, wherein the comparison circuit determines that the input current of the image data is out of the normal range when a ratio of a value obtained by multiplying the correction ratio and the reference current to the input current of the image data is smaller than a predetermined value.

7. The electronic device of claim 6, wherein the control circuit further comprises a blocking circuit which blocks the image data from being provided to the display panel when the input current of the image data is out of the normal range.

8. The electronic device of claim 1, wherein the correction ratio is determined based on a luminous efficiency of each of the plurality of areas.

9. The electronic device of claim 1, wherein the display panel comprises a first substrate and a second substrate disposed below the first substrate, the first substrate including a light control layer, and the second substrate including the plurality of light emitting elements.

10. The electronic device of claim 9, wherein the light control layer comprises a first wavelength conversion layer including a first illuminant, a second wavelength conversion layer including a second illuminant, and a light transmitting layer.

11. A method for driving an electronic device, the method comprising:

calculating compensation values for image data provided to each of a plurality of areas defined by a plurality of light emitting elements of a display panel;

outputting a correction ratio of each of the plurality of areas based on the compensation values; and determining whether an input current of the image data is in a normal range based on the correction ratio, wherein the outputting the correction ratio comprises:

defining a reference current; and defining the correction ratio based on the reference current and an area reference current in the normal range provided to an area of the plurality of areas, and wherein the correction ratio of the area of the plurality of areas has a first value for a single color and has a second value different from the first value for a mixed color which is different from the single color.

12. The method of claim 11, wherein the defining the reference current comprises selecting one of area reference currents provided to the plurality of areas.

13. The method of claim 11, wherein the defining the reference current comprises calculating an average value of area reference currents provided to the plurality of areas.

14. The method of claim 11, wherein the defining the reference current comprises selecting a maximum value among area reference currents provided to the plurality of areas.

15. The method of claim 11, wherein the defining the reference current comprises:

defining a first reference current applied to the single color; and defining a second reference current applied to the mixed color which is different from the single color.

16. The method of claim 11, wherein the determining whether the input current of the image data is in the normal range comprises:

determining that the input current of the image data is out of the normal range when a ratio of a value obtained by multiplying the correction ratio and the reference current to the input current of the image data is smaller than a predetermined value.

17. The method of claim 16, further comprising blocking the image data from being provided to the display panel when the input current of the image data is out of the normal range.

18. The method of claim 11, wherein in the outputting the correction ratio, the correction ratio is determined based on a luminous efficiency of each of the plurality of areas.

* * * * *